(12) United States Patent
Zhu

(10) Patent No.: US 7,755,171 B2
(45) Date of Patent: Jul. 13, 2010

(54) TRANSISTOR STRUCTURE WITH RECESSED SOURCE/DRAIN AND BURIED ETCH STOP LAYER AND RELATED METHOD

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 11/459,461

(22) Filed: Jul. 24, 2006

(65) Prior Publication Data
US 2008/0020536 A1    Jan. 24, 2008

(51) Int. Cl.
  *H01L 29/06* (2006.01)
(52) U.S. Cl. .................. 257/623; 257/19; 257/627; 257/E29.193; 438/740
(58) Field of Classification Search .......... 257/623, 257/19, E29.193
  See application file for complete search history.

(56) References Cited

U.S. PATENT DOCUMENTS

| | | | | |
|---|---|---|---|---|
| 5,105,362 | A * | 4/1992 | Kotani | 700/108 |
| 5,323,053 | A * | 6/1994 | Luryi et al. | 257/485 |
| 5,449,932 | A | 9/1995 | Fujii | |
| 5,972,762 | A | 10/1999 | Wu | |
| 6,406,973 | B1 * | 6/2002 | Lee | 438/416 |
| 6,420,218 | B1 | 7/2002 | Yu | |
| 6,841,831 | B2 | 1/2005 | Hanafi et al. | |
| 2003/0040158 | A1 * | 2/2003 | Saitoh | 438/279 |
| 2005/0009263 | A1 * | 1/2005 | Yeo et al. | 438/221 |
| 2005/0269561 | A1 * | 12/2005 | Chidambarrao et al. | 257/19 |

OTHER PUBLICATIONS

Chia-Hong Jan, et al. "A 65nm Ultra Low Power Logic Platform Technology Using Uni-axial Strained Silicon Transistors" Logic Technology Development, Intel Corporation, Hillsboro, OR, USA—IEEE 2005.

* cited by examiner

*Primary Examiner*—Thao X Le
*Assistant Examiner*—Ajay K Arora
(74) *Attorney, Agent, or Firm*—Ian MacKinnon; Hoffman Warnick LLC

(57) ABSTRACT

A transistor structure having a recessed source/drain and buried etch stop layer (e.g., a silicon germanium layer), and a related method, are disclosed. In one embodiment, the transistor structure includes a substrate including a substantially trapezoidal silicon pedestal over an etch stop layer; a gate atop the substantially trapezoidal silicon pedestal; a source/drain region extending into tapered surfaces of the substantially trapezoidal silicon pedestal and into the etch stop layer; and a stress liner overlying the gate and the source/drain region, the stress liner imparting a stress to the source/drain region and a channel of the gate. The recessed source/drain allows recessing without contacting the P-N junction, and allows improved application of stress to the channel.

9 Claims, 5 Drawing Sheets

TRANSISTOR STRUCTURE WITH RECESSED SOURCE/DRAIN AND BURIED ETCH STOP LAYER AND RELATED METHOD

BACKGROUND OF THE INVENTION

1. Technical Field

The invention relates generally to semiconductor device fabrication, and more particularly, to a transistor structure having a recessed source/drain and buried etch stop layer, such as a silicon germanium layer, and a related method.

2. Background Art

The application of stresses to field effect transistors (FETs) is known to improve their performance. When applied in a longitudinal direction (i.e., in the direction of electrical current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride liners. For example, a tensile-stressed silicon nitride liner may be used to cause tension in an NFET channel while a compressively-stressed silicon nitride liner may be used to cause compression in a PFET channel. Typically, the higher each of these stresses are, the better performance that is achieved. In order to increase each of these stresses, embedding the stress into source/drain regions is advantageous. One mechanism to provide this is to recess the source/drain regions and implement the stress into the replaced material. However, one challenge relative to this structure is not over-recessing (using too much depth of the source/drain extension region) such that the recess becomes too close or connects to the P-N junction of the source/drain region. Over-recessing causes current leakage in the device via the silicide formed in the recess. It is also important to obtain good control of the recess depth since it impacts the performance control of the device and the yield.

SUMMARY OF THE INVENTION

A transistor structure having a recessed source/drain and buried etch stop layer (e.g., a silicon germanium layer), and a related method, are disclosed. In one embodiment, the transistor structure includes a substrate including a substantially trapezoidal silicon pedestal over an etch stop layer; a gate atop the substantially trapezoidal silicon pedestal; a source/drain region extending into tapered surfaces of the substantially trapezoidal silicon pedestal and into the etch stop layer; and a stress liner overlying the gate and the source/drain region, the stress liner imparting a stress to the source/drain region and a channel of the gate. The recessed source/drain allows recessing without contacting the P-N junction, and allows improved application of stress to the channel.

A first aspect of the invention provides a transistor structure comprising: a substrate including a substantially trapezoidal silicon pedestal over an etch stop layer; a gate atop the substantially trapezoidal silicon pedestal; a source/drain extension region extending into tapered surfaces of the substantially trapezoidal silicon pedestal and into the etch stop layer; and a stress liner overlying the gate and the source/drain extension region, the stress liner imparting a stress to the source/drain extension region and a channel of the gate.

A second aspect of the invention provides a method comprising: providing a substrate including a silicon layer atop an etch stop layer; forming a gate atop the silicon layer; etching to remove the silicon layer stopping on the etch stop layer, the etching leaving the gate atop a substantially trapezoidal silicon pedestal; forming a source/drain extension region; and forming a stressed liner over the gate and source/drain extension region.

A third aspect of the invention provides a transistor structure comprising: an n-channel field effect transistor (NFET) and a p-channel field effect transistor (PFET) separated from the NFET by a trench isolation, each of the NFET and the PFET including: a substrate including a substantially trapezoidal silicon pedestal over a silicon-germanium (SiGe) etch stop layer, a gate atop the substantially trapezoidal silicon pedestal, a source/drain extension region extending into tapered surfaces of the substantially trapezoidal silicon pedestal and into the SiGe etch stop layer, and a silicide formed within tapered surfaces of the substantially trapezoidal silicon pedestal and a surface of the SiGe etch stop layer, a lower surface of the silicide is substantially uniformly distanced from a lowermost P-N junction of the source/drain extension region; a compressive stress liner overlying the PFET and imparting a compressive stress to the source/drain extension region and the p-channel; and a tensile stress liner overlying the NFET and imparting a tensile stress to the source/drain extension region and the n-channel.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
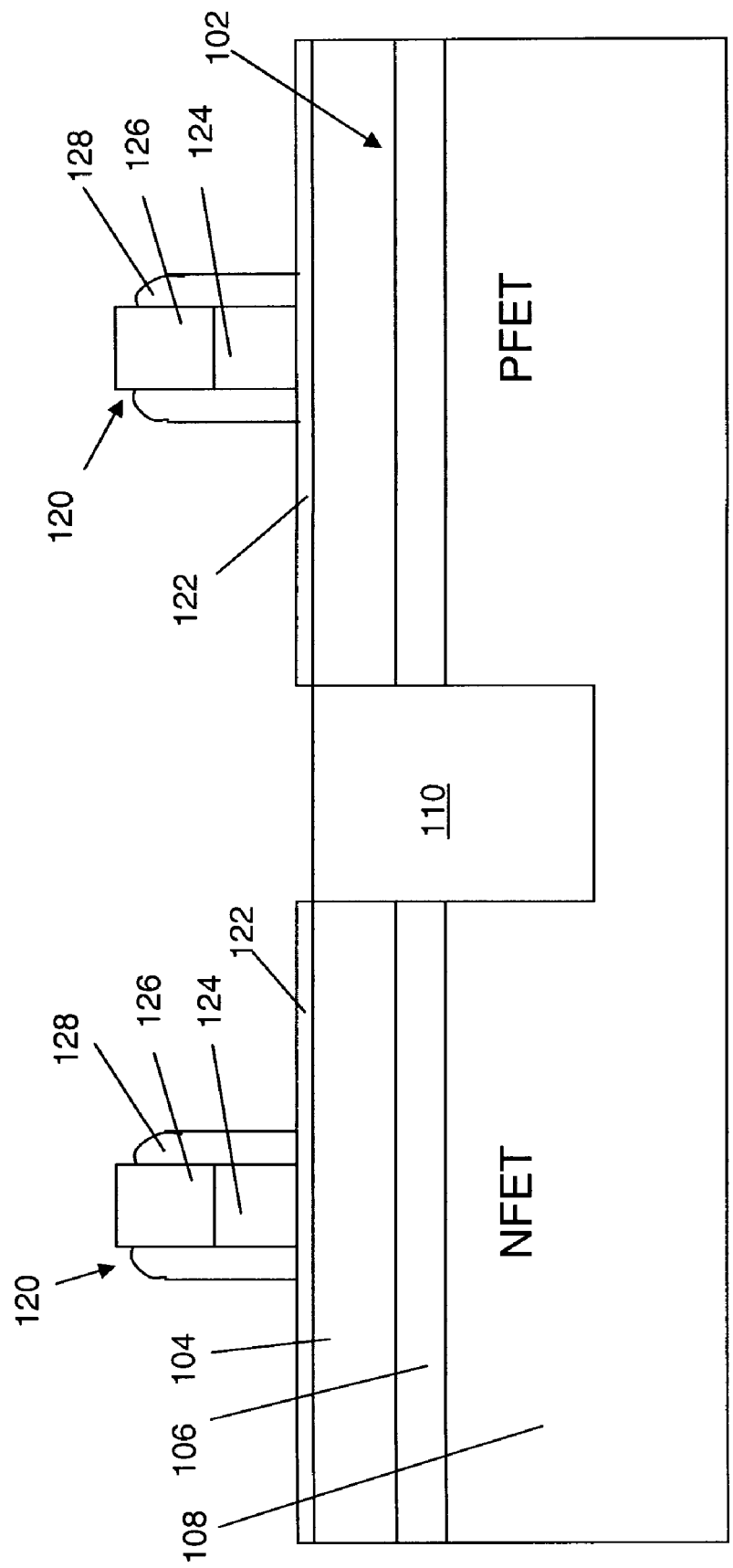
FIGS. 1-5 show one embodiment of a method according to the invention, with FIG. 5 also showing one embodiment of a transistor structure according to the invention.
Figure 3:
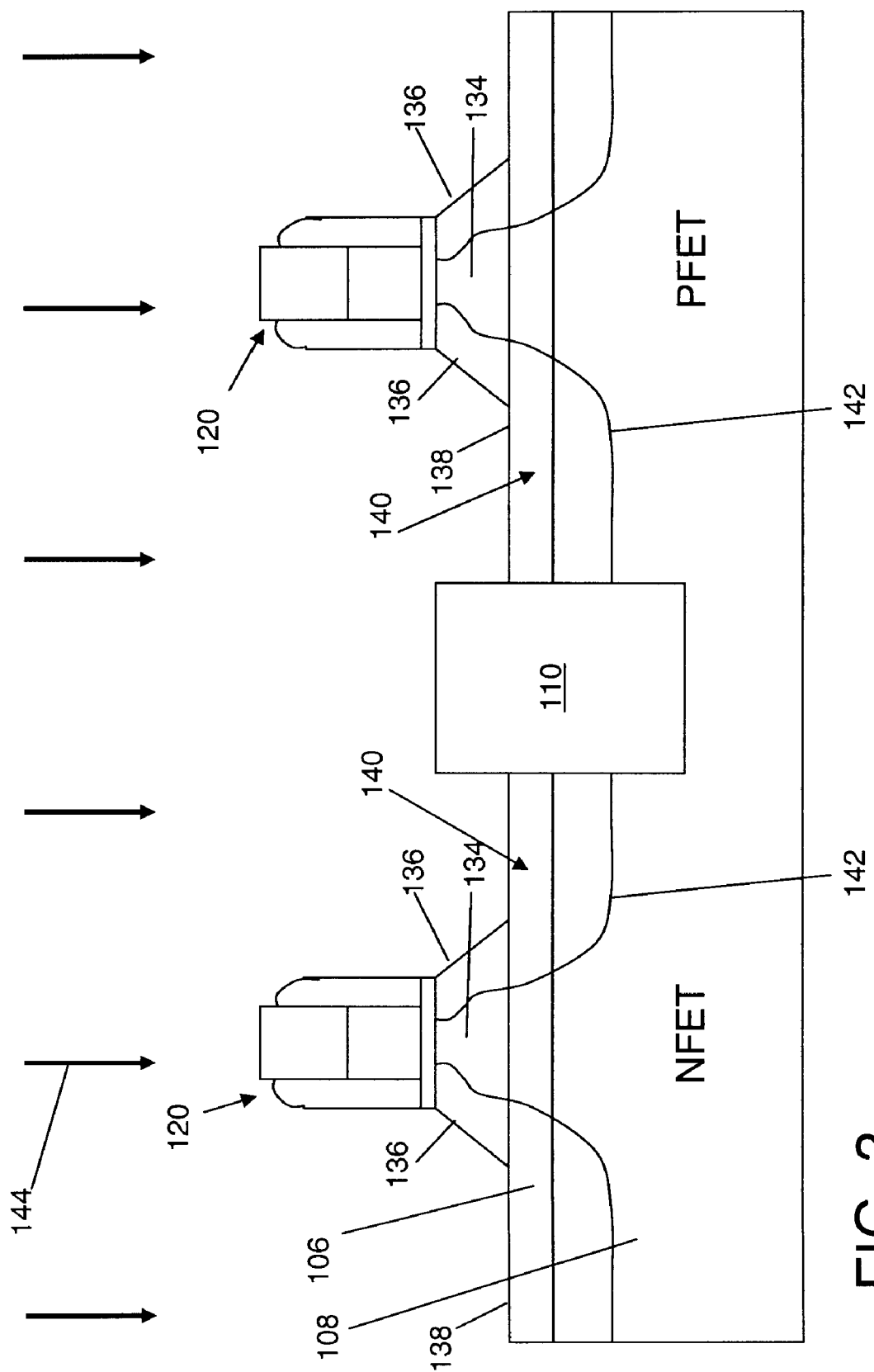
Figure 4:
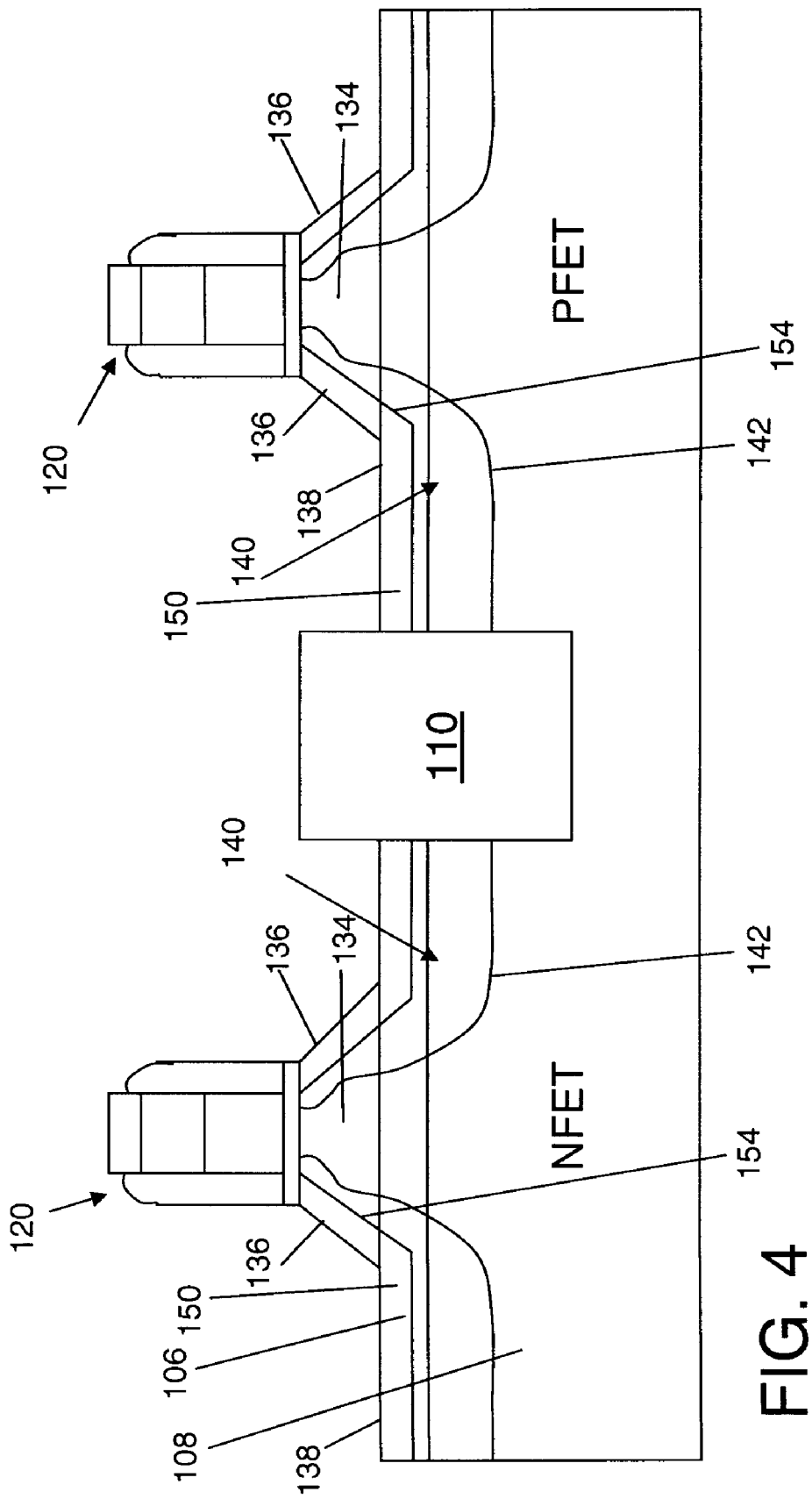
Figure 5:
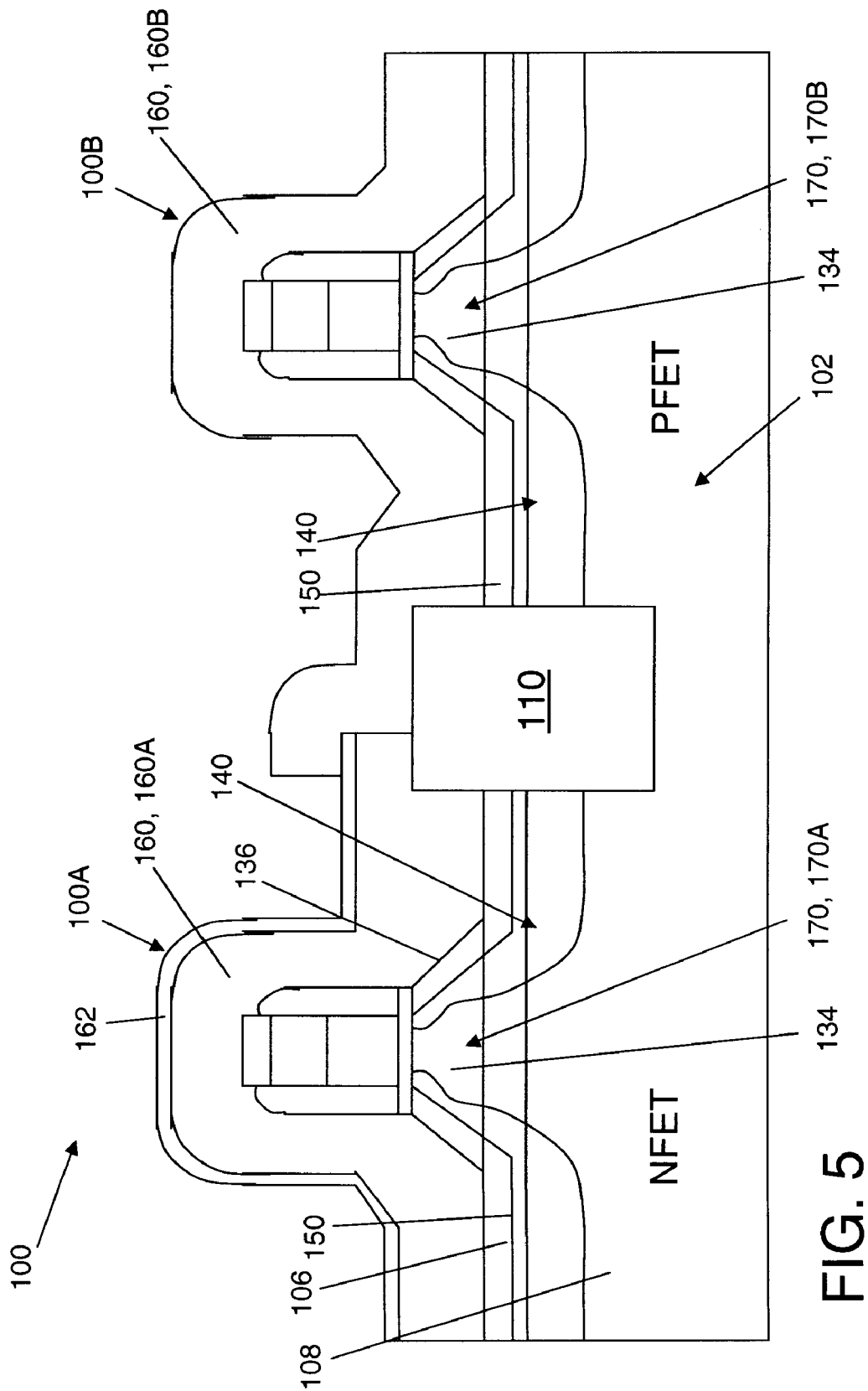

Turning to FIGS. 1-5, one embodiment of a method of forming a transistor structure 100 (FIG. 5) is shown. Transistor structure 100 may include an n-channel field effect transistor 100A (FIG. 5) and a p-channel field effect transistor 100B (FIG. 5). FIG. 1 shows providing a substrate 102 including a silicon layer 104 atop an etch stop layer 106. Hence, etch stop layer 106 is buried below silicon layer 104. As illustrated, substrate 102 is for a bulk silicon device(s). It should be recognized, however, that the teachings of the invention are also applicable to other substrates, e.g., silicon-on-insulator (SOI). In one embodiment, silicon layer 104 may have a (100) surface orientation, however, this is not necessary. As used herein, "surface orientation" or "crystalline surface orientation" refers to the crystallographic structure or periodic arrangement of silicon atoms on the surface of a structure. Substrate 102 may further include another silicon layer 108 under etch stop layer 106. Substrate 102 may be formed in any now known or later developed manner. In one example, etch stop layer 106 includes silicon germanium (SiGe) epitaxially grown on silicon layer 108, and then silicon layer 104 is epitaxially grown, e.g., by turning off the germanium (Ge). In this case, SiGe acts as an etch stop layer. Where SiGe is used, it may include, for example, approximately 20% germanium (Ge), but other concentrations are also possible. In addition, materials other than SiGe capable of stopping an etch may be employed. Etch stop layer 106 may have a thickness of, for example, approximately 10 nm to approximately 30 nm, and silicon layer 104 may have a thickness of approximately 20 nm to approximately 50 nm. However, the invention is not limited to those thicknesses.

FIG. 1 also shows forming a gate 120 atop silicon layer 104. A gate 120 may be formed for each FET 100A, 100B (FIG. 5). Gate 120 formation may include a variety of well known or later developed techniques for generating gate 120. For example, a trench isolation 110, e.g., a shallow trench isolation (STI) or deep trench isolation (DT), may be formed within substrate 102 so that different types of devices can be generated. Trench isolation 110 may include any isolation material, e.g., silicon oxide. Furthermore, a gate oxide layer 122 may be formed, followed by deposition of polysilicon 124 and deposition of polysilicon germanium 126. Conventional lithography to pattern gate 120 may be performed, followed by conventional halo and extension implantation (not shown), including a thermal anneal to remove implant damage. A spacer(s) 128 may be formed for each gate 120. Other techniques may also be employed to form gate 120, and are within the scope of the invention.

Figure 2:
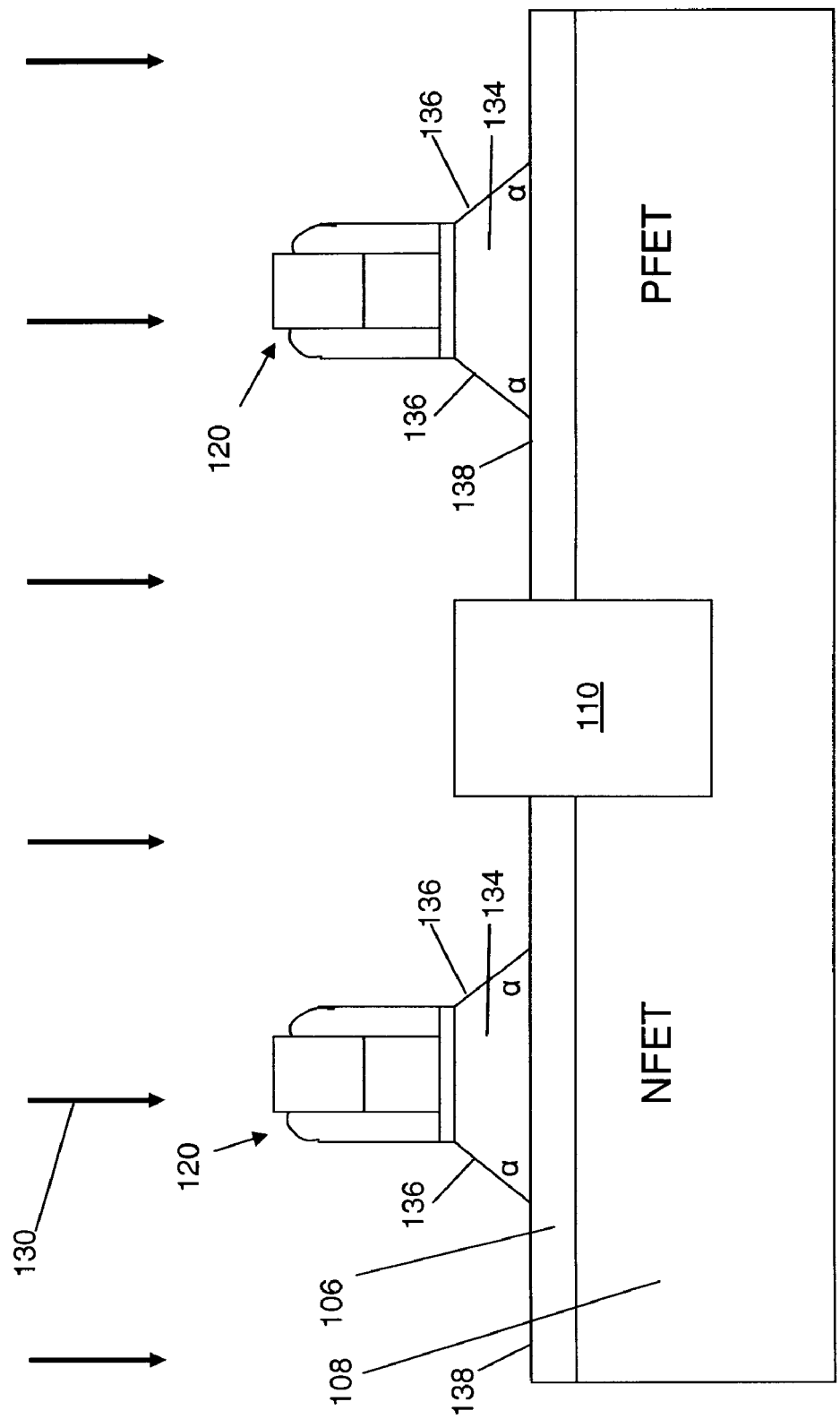

FIG. 2 shows etching 130 to remove silicon layer 104 (FIG. 1) to etch stop layer 106. Etching 130 may initially include a silicon oxide etch, e.g., a reactive ion etch (RIE) or other appropriate etch, to remove gate oxide layer 122. Next, etching 130 may include an anisotropic etch using a wet etch chemistry. In one embodiment, the wet etch chemistry includes tetramethyl ammonium hydroxide (TMAH) to anisotropically etch silicon layer 104. However, other wet etch chemistries may be employed. For example, potassium hydroxide (KOH) and ethylene diamine pyrocatechol (EDP) can etch Si anisotropically, and may be used if they can be configured to stop on etch stop layer 106. As shown in FIG. 2, etching 130 leaves gate 120 atop a substantially trapezoidal silicon pedestal 134. Substantially trapezoidal silicon pedestal 134 may include tapered surfaces 136 having a (111) or (110) crystalline surface orientation, i.e., where silicon layer 104 has a (110) surface orientation. In this case, silicon pedestal 134 has tapered surfaces 136 angled ($\alpha$) at approximately 54° relative to a surface 138 of etch stop layer 106. Etching 130 creates tapered surfaces 136 because the wet etch chemistry has different etching rates for different surface orientations.

Next, as shown in FIG. 3, a source/drain extension region 140 is formed for each gate 120. This process may include, for example, implanting 144 dopants into tapered surfaces 136 of silicon pedestal 134 and etch stop layer 106, and annealing. Source/drain extension region 140 extends laterally within silicon layer 108. A P-N junction 142 is formed as part of source/drain extension region 140 after source/drain anneal that removes implant damage and activate the dopants. As illustrated, due to silicon pedestal 134, source/drain extension region 140 and P-N junction 142 extend downwardly and outwardly from gate 120 in a steeper manner than conventional devices. In addition, P-N junction 142 is distanced from and substantially follows tapered surfaces 136 and surface 138 of etch stop layer 106. As shown in FIG. 4, this process may further include forming a silicide 150 within tapered surfaces 136 of silicon pedestal 134 and surface 138 of etch stop layer 106. (Silicide may also form atop gate 120.) Note, however, that silicide 150 does not penetrate P-N junction 142. In particular, a lower surface 154 of silicide 150 is substantially uniformly distanced from a lowermost P-N junction 142 of source/drain extension region 140. Silicide 150 may be formed in any now known or later developed manner, e.g., depositing a metal such as cobalt or nickel, and annealing.

FIG. 5 shows forming a stressed liner 160 over gate 120 and source/drain region 140. As illustrated and as known in the art, different types of devices require different types of stress liners to improve performance. More particularly, a tensile silicon nitride liner 160A is formed for NFET 100A and a compressive silicon nitride liner 160B is formed for PFET 100B. Tensile silicon nitride liner 160A may include a silicon oxide layer 162 thereover. Any now known or later developed techniques for forming stressed liner 160 may be employed. For example, the technique may include depositing tensile silicon nitride liner 160A and silicon oxide layer 162 over all gates 120, etching to remove liner 160A and layer 162 over PFETs 100B, depositing compressive stress liner 160B over all devices and etching to remove liner 160B over NFETs 100A.

The resulting transistor structure 100 includes substrate 102 including substantially trapezoidal silicon pedestal 134 over etch stop layer 106, gate 120 atop substantially trapezoidal silicon pedestal 134, source/drain extension region 140 extending into tapered surfaces 136 (FIG. 4) of silicon pedestal 134 and into etch stop layer 106, and a stress liner 160A or 160B overlying gate 120 and source/drain extension region 140. Stress liner 160A or 160B impart a stress to source/drain extension region 140 and a channel 170 of gate 120. That is, a compressive stress liner 160B overlays PFET 100B and imparts a compressive stress to source/drain extension region 140 thereof and p-channel 170B of PFET 100B, and a tensile stress liner 160A overlays NFET 100A and imparts a tensile stress into source/drain extension region 140 thereof and n-channel 170B of NFET 100A.

Transistor structure 100 includes a recessed, stressed source/drain extension region 140 that does not have silicide 150 penetrating P-N junction 142. In addition, the stress imparted follows the shape of P-N junction 142, thus imparting more stress to channel 170 and further improving device performance compared to conventional devices.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A transistor structure comprising:
a substrate including a substantially trapezoidal silicon pedestal over an etch stop layer;
a gate atop the substantially trapezoidal silicon pedestal;
a source/drain extension region extending into the substantially trapezoidal silicon pedestal at tapered surfaces thereof and into the etch stop layer;
a silicide within the substantially trapezoidal silicon pedestal; wherein the silicide is formed within the etch stop layer, and wherein a lower surface of the silicide is substantially uniformly distanced from a lowermost P-N junction of the source/drain extension region; and
a stress liner overlying the gate and the source/drain extension region, the stress liner imparting a stress to the source/drain extension region and a channel of the gate.

2. The transistor structure of claim 1, wherein the substantially trapezoidal silicon pedestal has one of: a (111) crystalline surface orientation on a tapered surface thereof and a (110) crystalline surface orientation on a tapered surface thereof.

3. The transistor structure of claim 1, wherein the tapered surfaces are angled at approximately 54° relative to the etch stop layer.

4. The transistor structure of claim 1, wherein the etch stop layer includes silicon germanium (SiGe).

5. The transistor structure of claim 1, wherein the substrate further includes a silicon layer under the etch stop layer, the source/drain extension region extending laterally within the silicon layer.

6. A transistor structure comprising:
   an n-channel field effect transistor (NFET) and a p-channel field effect transistor (PFET) separated from the NFET by a trench isolation, each of the NFET and the PFET including:
      a substrate including a substantially trapezoidal silicon pedestal over a silicon-germanium (SiGe) etch stop layer,
      a gate atop the substantially trapezoidal silicon pedestal,
      a source/drain extension region extending into the substantially trapezoidal silicon pedestal at tapered surfaces thereof and into the SiGe etch stop layer, and
      a silicide formed within the substantially trapezoidal silicon pedestal and a surface of the SiGe etch stop layer, a lower surface of the silicide is substantially uniformly distanced from a lowermost P-N junction of the source/drain extension region;
   a compressive stress liner overlying the PFET and imparting a compressive stress to the source/drain extension region and the p-channel; and
   a tensile stress liner overlying the NFET and imparting a tensile stress to the source/drain extension region and the n-channel.

7. The transistor structure of claim 6, wherein the substantially trapezoidal silicon pedestal has one of: a (111) crystalline surface orientation and a (110) crystalline surface orientation on a tapered surface thereof.

8. The transistor structure of claim 6, wherein the tapered surfaces are angled at approximately 54° relative to the SiGe etch stop layer.

9. The transistor structure of claim 6, wherein the substrate further includes a silicon layer under the SiGe etch stop layer, the source/drain extension regions extending laterally within the silicon layer.

* * * * *